(12) United States Patent
Reznikov et al.

(10) Patent No.: US 6,378,965 B1
(45) Date of Patent: *Apr. 30, 2002

(54) DISK DRIVE BRACKET

(75) Inventors: Naum Reznikov, Chadbourne; Michael F. McCormick, Jr., San Jose; Ehsan Ettehadieh, Berkeley; Daniel Hruska, San Carlos; Anthony N. Eberhardt, Los Gatos, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/490,851

(22) Filed: Jan. 24, 2000

Related U.S. Application Data

(62) Division of application No. 08/905,464, filed on Aug. 4, 1997, now Pat. No. 6,067,225.

(51) Int. Cl.[7] .................................................. H05K 7/18
(52) U.S. Cl. ................. 312/332.1; 361/727; 292/341.15
(58) Field of Search ............................... 361/726, 732, 361/685, 727, 725; 292/175, 341.15, 102, 106, 203, 207, DIG. 11; 312/223.2, 223.1, 333, 332.1, 222; 439/928.1

(56) References Cited

U.S. PATENT DOCUMENTS

| | | | |
|---|---|---|---|
| 3,193,342 A | * | 7/1965 | Sauter ..................... 312/332.1 |
| 5,172,520 A | * | 12/1992 | Hostetler et al. ........ 292/207 X |
| 5,222,897 A | | 6/1993 | Collins et al. |
| 5,229,919 A | | 7/1993 | Chen |
| 5,332,306 A | | 7/1994 | Babb et al. |
| 5,442,513 A | | 8/1995 | Lo |
| 5,483,419 A | | 1/1996 | Kaczeus, Sr. et al. |
| 5,557,499 A | | 9/1996 | Reiter et al. |
| 5,563,767 A | | 10/1996 | Chen |
| 5,653,518 A | | 8/1997 | Hardt |
| 5,654,873 A | | 8/1997 | Smithson et al. |
| 5,673,172 A | | 9/1997 | Hastings et al. |
| 5,734,557 A | | 3/1998 | McAnally et al. |
| 6,067,225 A | * | 5/2000 | Reznikov et al. ......... 312/223.2 |
| 6,193,339 B1 | * | 2/2001 | Behl et al. ............... 312/223.2 |

FOREIGN PATENT DOCUMENTS

FR       2686118    *  7/1993   .......... 292/DIG. 11

* cited by examiner

Primary Examiner—Janet M. Wilkens
(74) Attorney, Agent, or Firm—Conley, Rose & Tayon, PC; Robert C. Kowert (57) ABSTRACT

A bracket having two parallel sides and an interconnecting crosspiece is attached to a disk drive or similar peripheral with the sides of the bracket extending longitudinally of the sides of the drive and the crosspiece extending across the front of the drive. A chassis of a computer or the like has internal parallel sides formed with horizontal guides to receive the bracket, a substantially open front face and an internal connector engageable with a mating connector on the rear of the drive when the bracket is fully inserted in the chassis. The sides of the bracket have features to protect the drive from horizontal and vertical vibrations. A handle is pivoted to the crosspiece near one end moveable between at least three positions: a first or latched position parallel to the crosspiece, a second position swinging out at about a 15° angle and a third position at about a 45° angle. In second position a first point on the end of the handle engages the front edge of the side and a second point is about to enter a slot in one side of the chassis. As the handle is pivoted toward third position the second point engages a margin of the slot and pulls the two connectors apart. To reinsert the drive, the positions of the handle are reversed. A spring biased latch engages a hook on handle. A second spring opens the unlatched handle from the first to second positions.

20 Claims, 9 Drawing Sheets

DISK DRIVE BRACKET

This application is a divisional application of U.S. patent application Ser. No. 08/905,464, entitled "Disk Drive Bracket", filed Aug. 4, 1997, which issued on May 23, 2000, as U.S. Pat. No. 6,067,225.

BACKGROUND OF THE INVENTION

1. Field of the Invention

This invention relates to a new and improved disk drive bracket. More particularly, the invention relates to a bracket which is attached to a disk drive and is used in inserting and removing the disk drive from guideways formed in the chassis of a computer or related equipment.

2. Description of Related Art

Brackets attached to disk drives for purposes similar to the purpose of the present invention are common. The present invention, however, has considerable advantages over prior brackets, as hereinafter explained.

SUMMARY OF THE INVENTION

The present invention comprises a U-shaped bracket, the sides of which are attached to the sides of a disk drive or similar equipment. The sides are provided with means to reduce vibration once the drive is installed in the chassis.

A handle is pivoted to the crosspiece of the bracket and is held in closed position by a hook attached to the handle fitting into an opening in the crosspiece to latch behind a detent on a spring biased slide. By moving the slide laterally, the detent disengages from the hook and a spring causes the hook to pivot outwardly.

When the disk drive with slide attached is to be inserted in the guideways, the handle is open as the bracket is pushed inwardly until stops thereon engage the chassis. At this point the conventional plug on the inner end of the disk drive is not in engagement with the socket fixed to the chassis. As the handle is swung to closed position, hooks on the handle engage a slot in the side of the chassis to pull the disk drive plug into engagement with the chassis socket in a positive, gradual movement.

When thus installed, the disk drive is locked in place. When it is necessary to remove the disk drive, the user pushes the slide laterally. This releases the handle to swing outwardly to a first open position with protrusions on the handle engaging the chassis to prevent overmovement of the handle. At this point the electrical contact between the disk drive and the chassis socket is intact.

The next step in disengagement of the disk drive from the chassis is for the user to swing the handle further outwardly to a second position. This causes a hook on an extension of the handle to engage a flange in the side of the chassis and positively push the drive bracket add disk drive outwardly to disengage the plug from the socket. Thereafter the user may pull the disk drive out of the guideways and may use the handle to carry the disk drive, if desired.

Accordingly the present invention guides and regulates movement of the disk drive in insertion and removal from guideways in the chassis. More particularly, the present invention causes the socket and plug of the chassis and drive to engage and disengage gradually so that they are unlikely to engage and disengage improperly or to break the pins on the plug. Furthermore electrical contact is disengaged slowly so that sparks or other undesirable effects are reduced or eliminated.

Another feature of the invention is the fact that the bracket and disk drive lock into the chassis more reliably and there is very little likelihood that the drive will spring open.

A further feature of the bracket is that it reduces vibration of the disk drive when the chassis is subjected to vibration or shock. Further, the screws which hold the bracket onto the disk drive make electrical contact therewith and also with metallic springs on the exterior of the bracket which engage the chassis.

Still another feature of the invention is the reduction in space occupied by the bracket as compared with previous structures.

BRIEF DESCRIPTION OF THE DRAWING

The accompanying drawings, which are incorporated in and form a part of this specification, illustrate embodiments of the invention and, together with the description serve to explain the principles of the invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

A computer or other electronic device is provided with a chassis 21 formed with parallel sides 22, usually of sheet metal, and fabricated so as to provide spaced guides 23 or trackways for a disk drive 24 or other removable component. It will be understood that a plurality of disk drives 24 are frequently installed in the chassis 21, the number, size and spacing thereof being subject to considerable variation. At the back of the chassis is a plurality of stationary sockets 26, each of which may be removably electrically connected to a disk drive 24 installed in a trackway 23 of the chassis. It will be noted that along one edge of at least one of the sides 22 is a slot 27. Functional equivalents of slot 27 will readily occur to one skilled in the art. The front edge of side 22 is shown as a flange 28.

Disk drive 24 is also subject to considerable variation, and it will be understood that other components besides disk drive may be used with the present invention. The components of the disk drive are not herein described since such components form no part of the present invention. A plug 31 is provided at the rear of drive 24 to engage socket 26.

A U-shaped bracket 36 in accordance with the present invention is applied across the front and along both sides of the disk drive 24. Sides 37 of bracket 36 are formed with holes 38 for passage of screws 39 to make electrical and mechanical contact with the sides of the disk drive 24. Spring clips 41 formed of metal and curved in shape are held at the front and back end of each side 37 by screws 39 passing through holes 38. Preferably the spring clips 41 are positioned in recesses 42 formed in sides 37. Between holes 38, the sides are formed with splits 43, the portions of the sides 37 above and below the splits 43 being formed with outward bulges 44. The splits 43 and the bulges 44 form a plastic spring which bias the top and bottom bulges 44 outwardly to resiliently engage the bottom and top guides 23 of the chassis 21. Similarly, the spring clips 41 engage the sides of the chassis in resilient fashion. Hence, vibration of the disk drive within the chassis is damped both vertically and horizontally. The metal clips 41 and metal screws 39 establish electrical contact between the sides 22 of the chassis and the disk drive 24.

Crosspiece 46 integrally interconnects the forward ends of the sides 37, and has an upward extension 47 so that the front profile of the crosspiece 46 is substantially that of the front of the disk drive 24. An opening 48 is formed to one side of the center of crosspiece 46, and the front of the crosspiece 46 to the right of the opening 48 is formed with a recess 49. A narrow, vertical second recess 51 is formed to the left of the opening 48 so that there is a retainer-defining portion. At the left end of crosspiece 46 there are outward extensions or stops 52 which project outwardly beyond the adjacent side 37. Adjacent the left end of crosspiece 46 is a socket 53 for a coil spring 54, hereinafter described.

Latch spring 56 fits into recesses 49, 51, and extends across opening 48 in crosspiece 46. Spring 56 may be made of many different materials. A presently preferred material is Cycoloy C2950 HF sold by GE Plastics. Latch spring 56 has a slide 57 shaped to slide horizontally in the recess 49 and is itself formed with a recess 58 for insertion of a finger of the user in order to slide the latch spring 56 to the right.

Extending to the left of slide 57 are upper and lower curved spring portions 61, 62 which are integral with the slide 57. Each spring portion 61, 62 is formed with one inward curve and an outward curve, there being a slight space 63 between the innermost curved portions of the upper and lower springs. The left ends of the springs are joined to an integral vertical connector 64 which fits into the recess 51. The parts of the latch spring are so dimensioned as to snap into recesses 49 and 51 and be held therein.

Handle 66 is pivoted to crosspiece 46 by means of pins 67 which fit through holes 68 in left side enlargements 69 of the handle 66, and likewise fit into blind holes 71 in crosspiece 46. A retainer 72 on the inside of handle 66 fits into the end of coil spring 54 to hold the spring in place. Flanges 73 on the right end of handle 66 extend rearward to fit over the top and bottom of crosspiece 46 to hold handle 66 in alignment with spring 56 when closed. Adjacent the right end of handle 66 is an opening 76. A hook 77 fits through the opening 76 and has a barb 78 on its right-hand end. Hence, when the handle 66 is closed against the force of spring 54, the hook 77 enters the space 63 between the inward-curved portions of spring portions 61, 62 and protrusion 79. The barb 78 engages behind the protrusion 79 of hook 77 and holds the handle closed. When the user pushes the slide 57 or detent to the right, the latch spring portions 61, 62 are stressed, releasing hook 77 and allowing the handle 66 under the influence of coil spring 54 to swing outward. To limit outward swinging of handle 66, a notch 91 is formed in crosspiece 46 adjacent the left end thereof. Edge 92 of handle 66 enters notch 91 when the handle 66 is full open (see FIG. 6A) and thereby limits outward movement to about 45°.

Figure 7A:
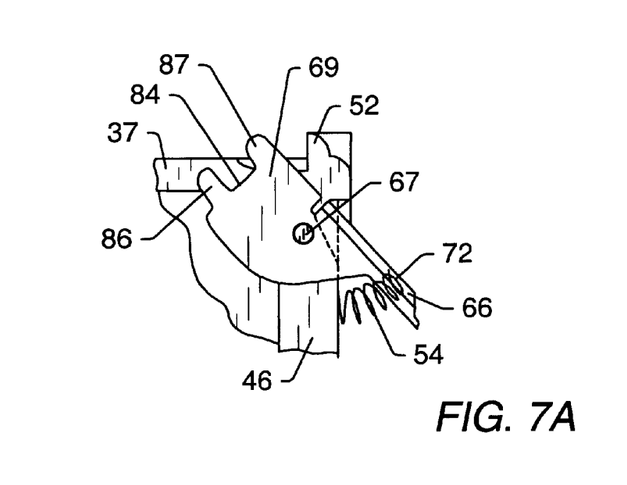
FIG. 7A is a fragmentary bottom plan view of a portion of the handle and bracket.
Figure 7B:
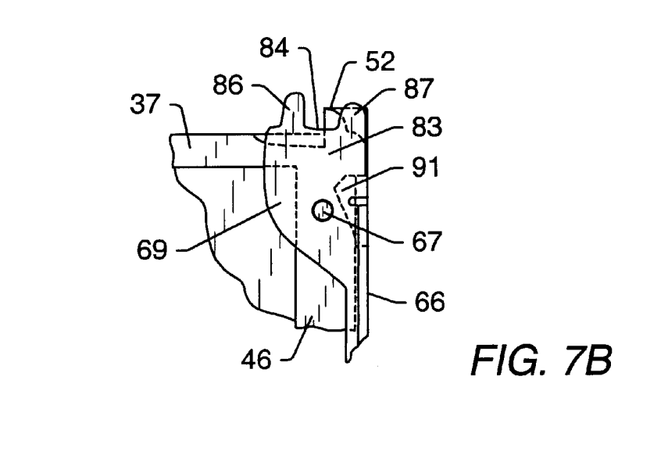
FIG. 7B is a view similar to FIG. 7A showing the handle closed.
Figure 8:
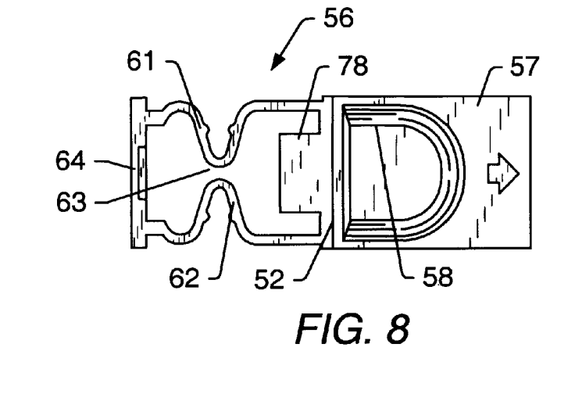
FIG. 8 is a front elevational view of the slide which is to fit into the crosspiece of the bracket.
Figure 9:
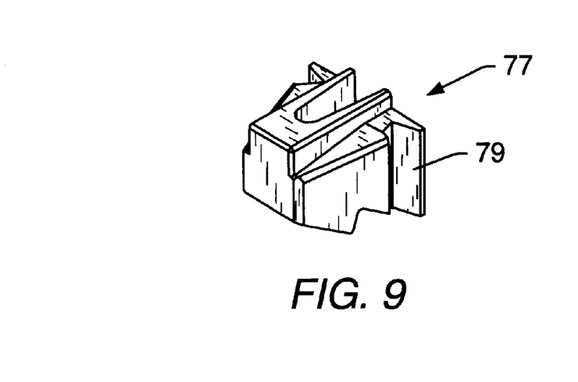
FIG. 9 is an enlarged perspective view of a hook attached to the handle.
Figure 10A:
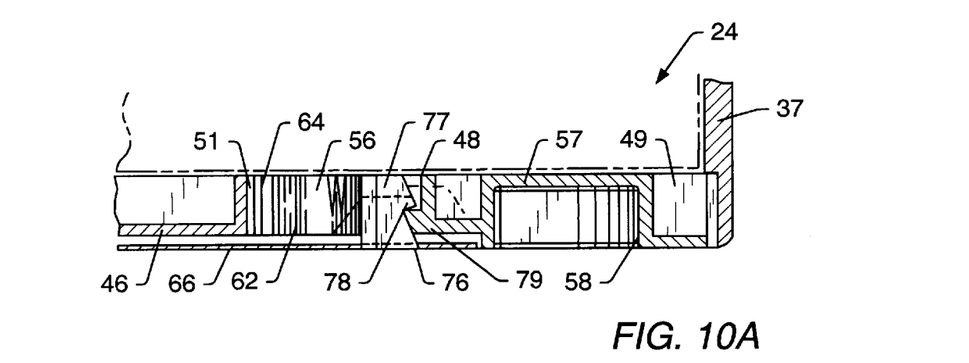
FIG. 10A is a fragmentary sectional view taken substantially along the line 10—10 of FIG. 5 showing the parts assembled and the handle closed.
Figure 10B:
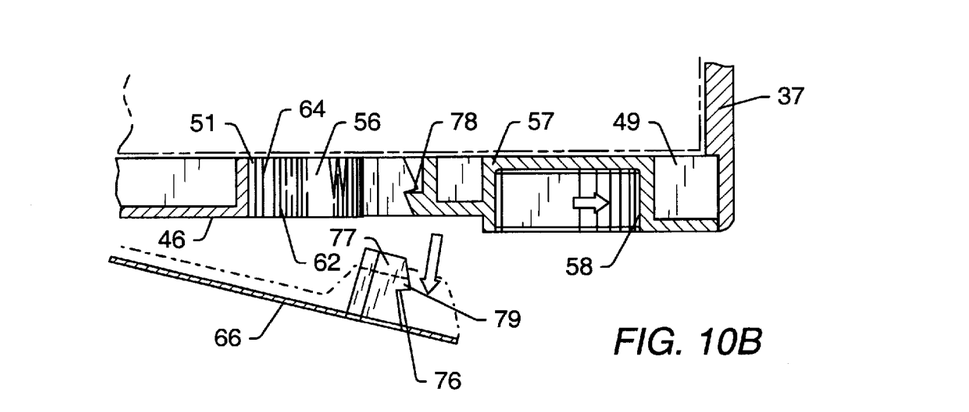
FIG. 10B is a view similar to FIG. 10A showing the handle partly open.

Top enlargement 69 of the left side of the handle 66 has a protrusion 81 which termites in a rounded point 82 which is substantially in the same position as stop 52. The bottom protrusion 83 is formed with a notch 84, one finger 86 of the protrusion extending out beyond stop 52 (see FIG. 7B). Rounded point 87 on bottom protrusion 83 corresponds to and moves with rounded point 82.

Operation

Figure 1:
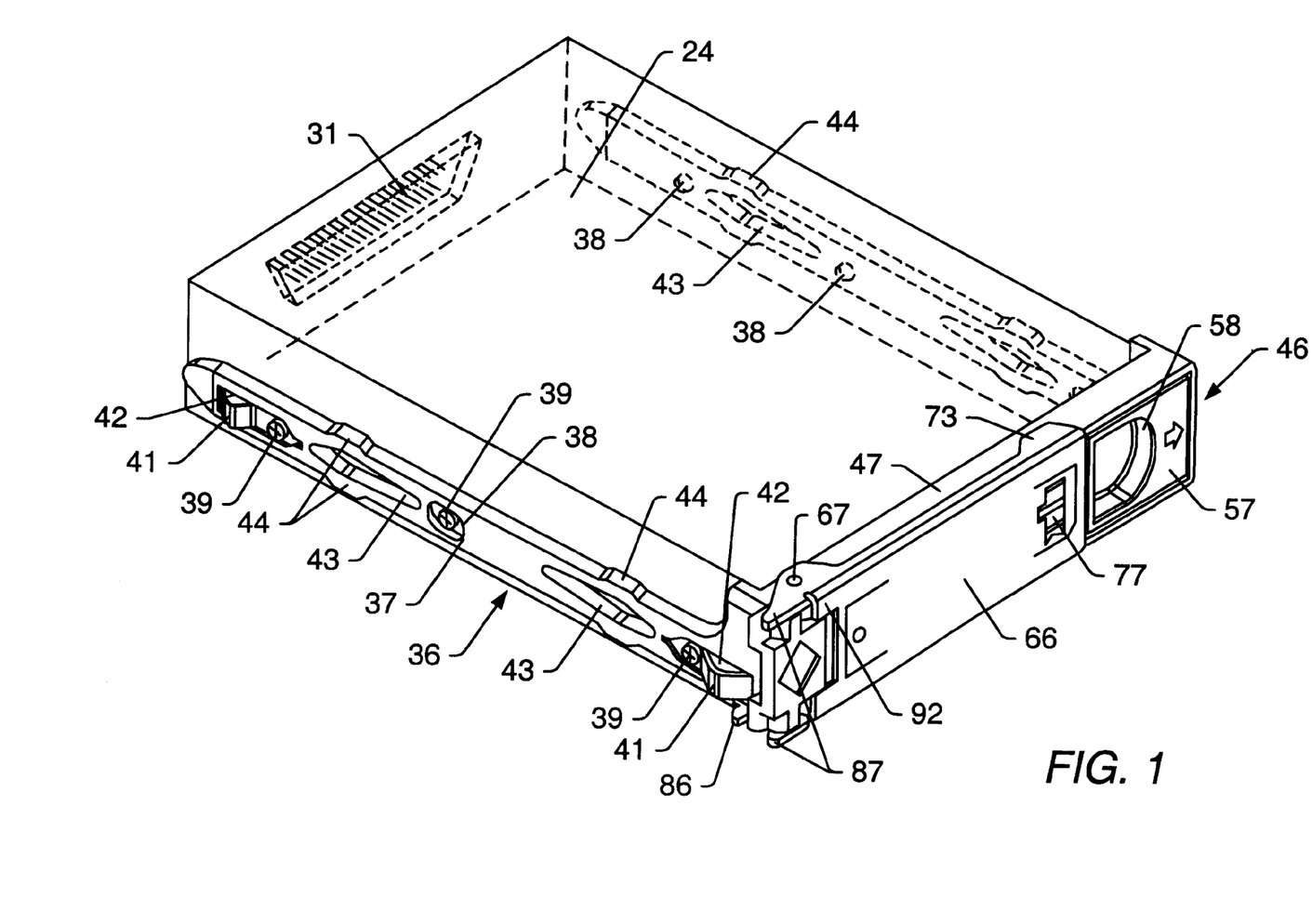
FIG. 1 is a perspective view of a bracket in accordance with the present invention mounted on a disk drive, which is shown schematically.
Figure 2:
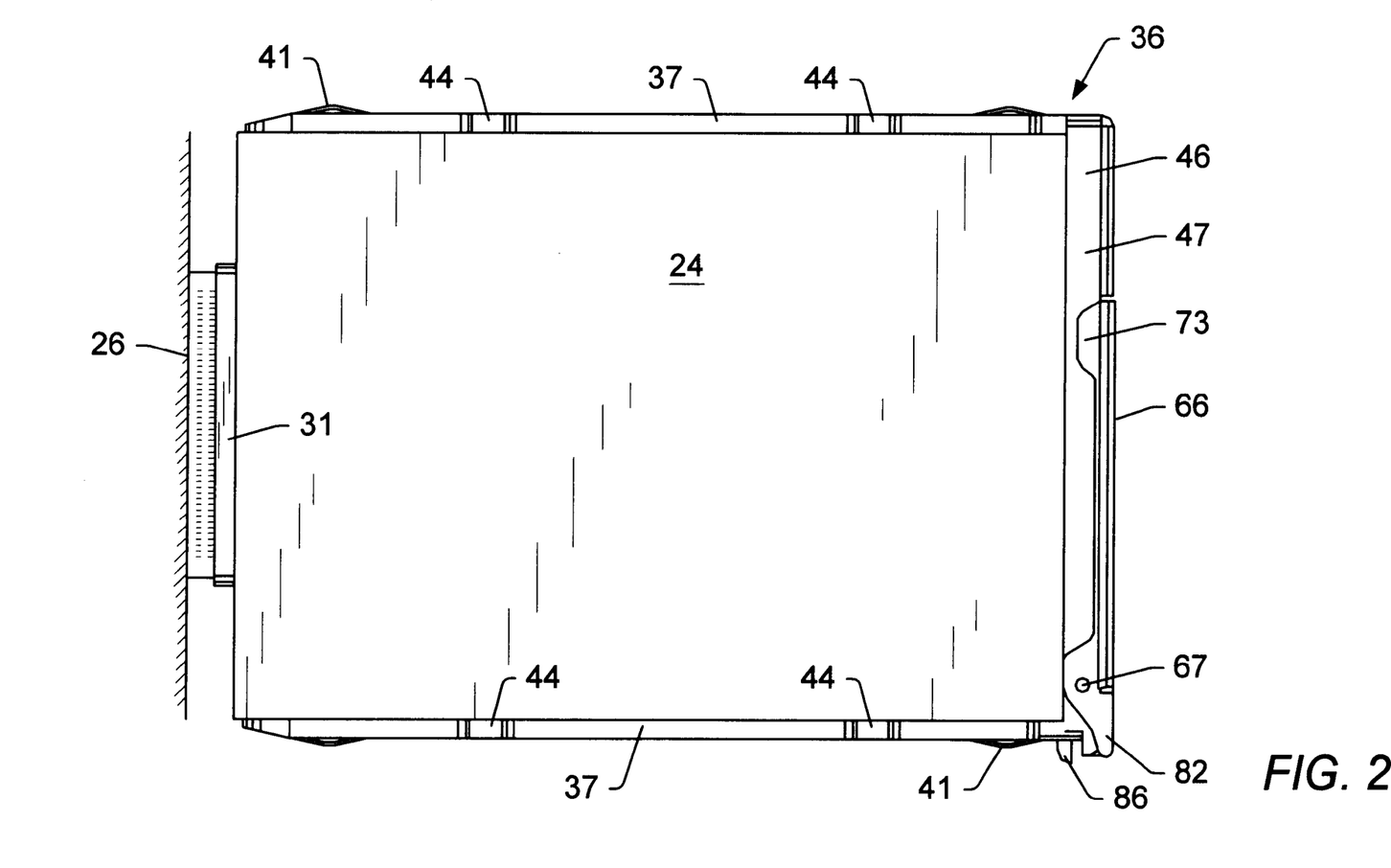
FIG. 2 is a top plan view of the structure of FIG. 1.
Figure 3:
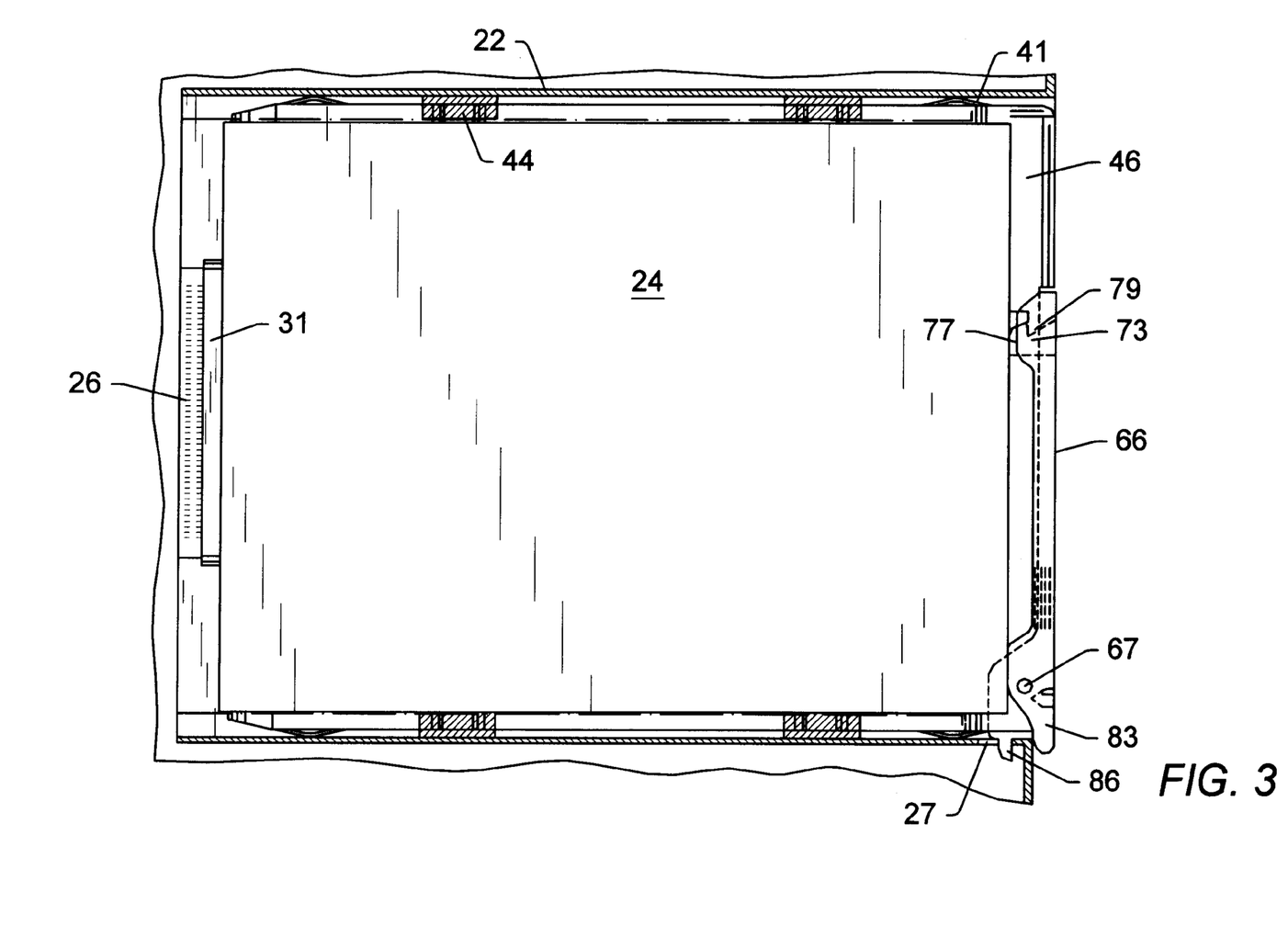
FIG. 3 is a view similar to FIG. 2 showing the bracket and drive installed in guideways in a computer.
Figure 4:
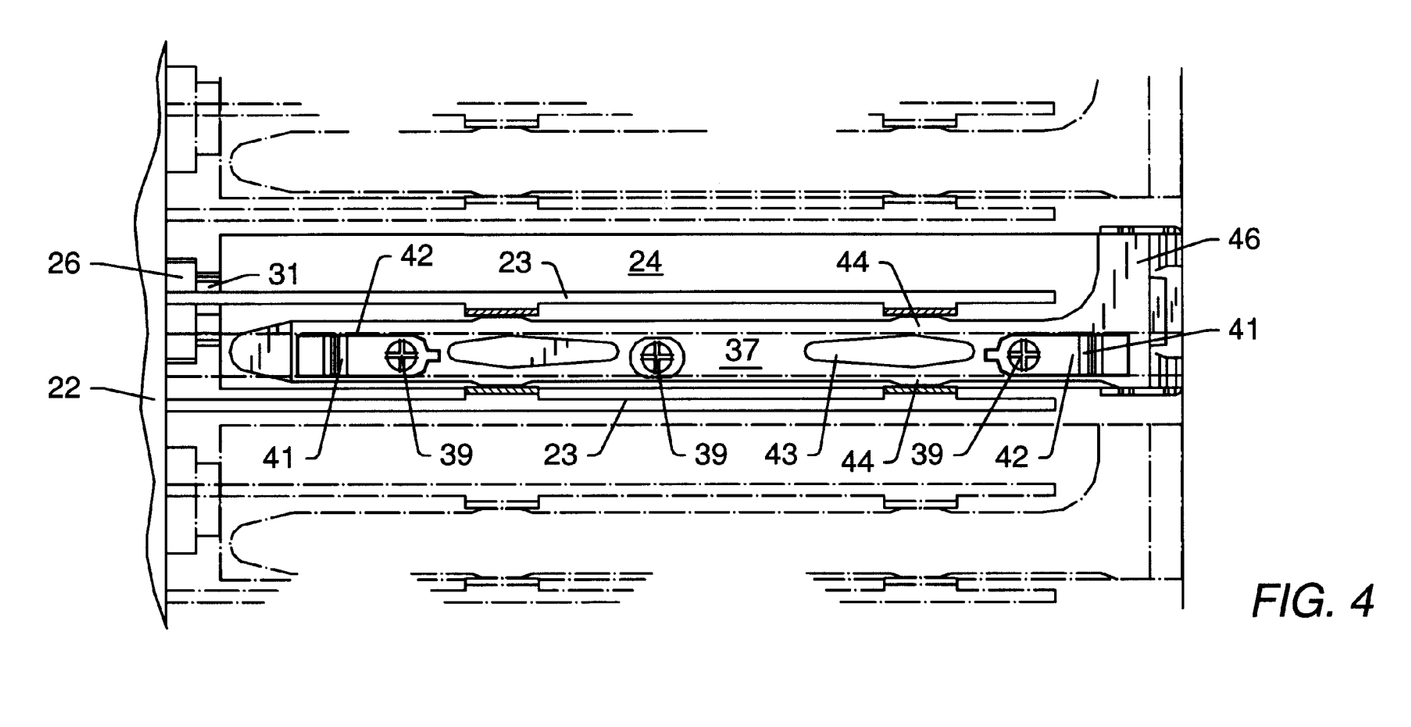
FIG. 4 is a schematic side elevational view showing the bracket and drive installed in guideways a computer.
Figure 5:
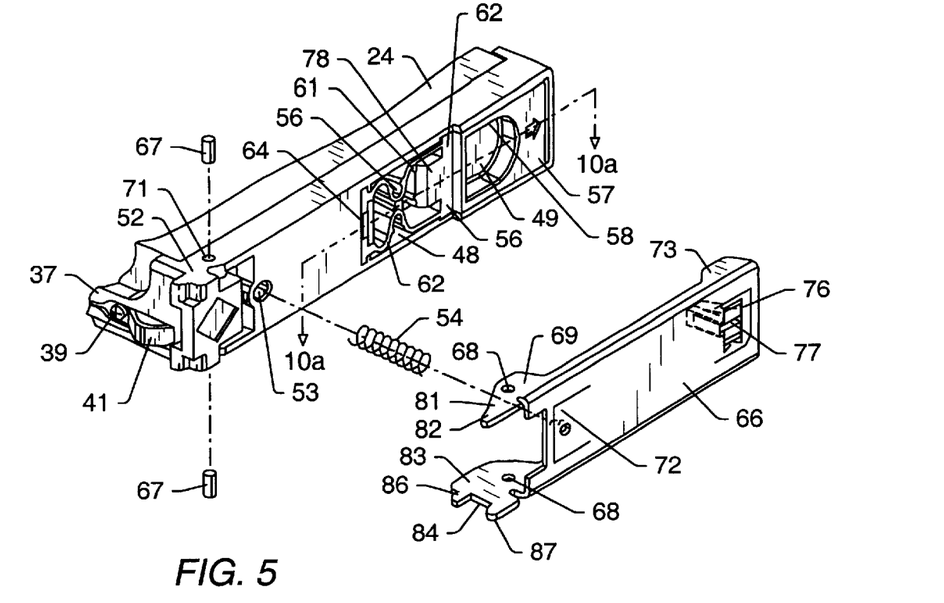
FIG. 5 is an exploded perspective view of the crosspiece of the bracket and its handle.
Figure 6A:
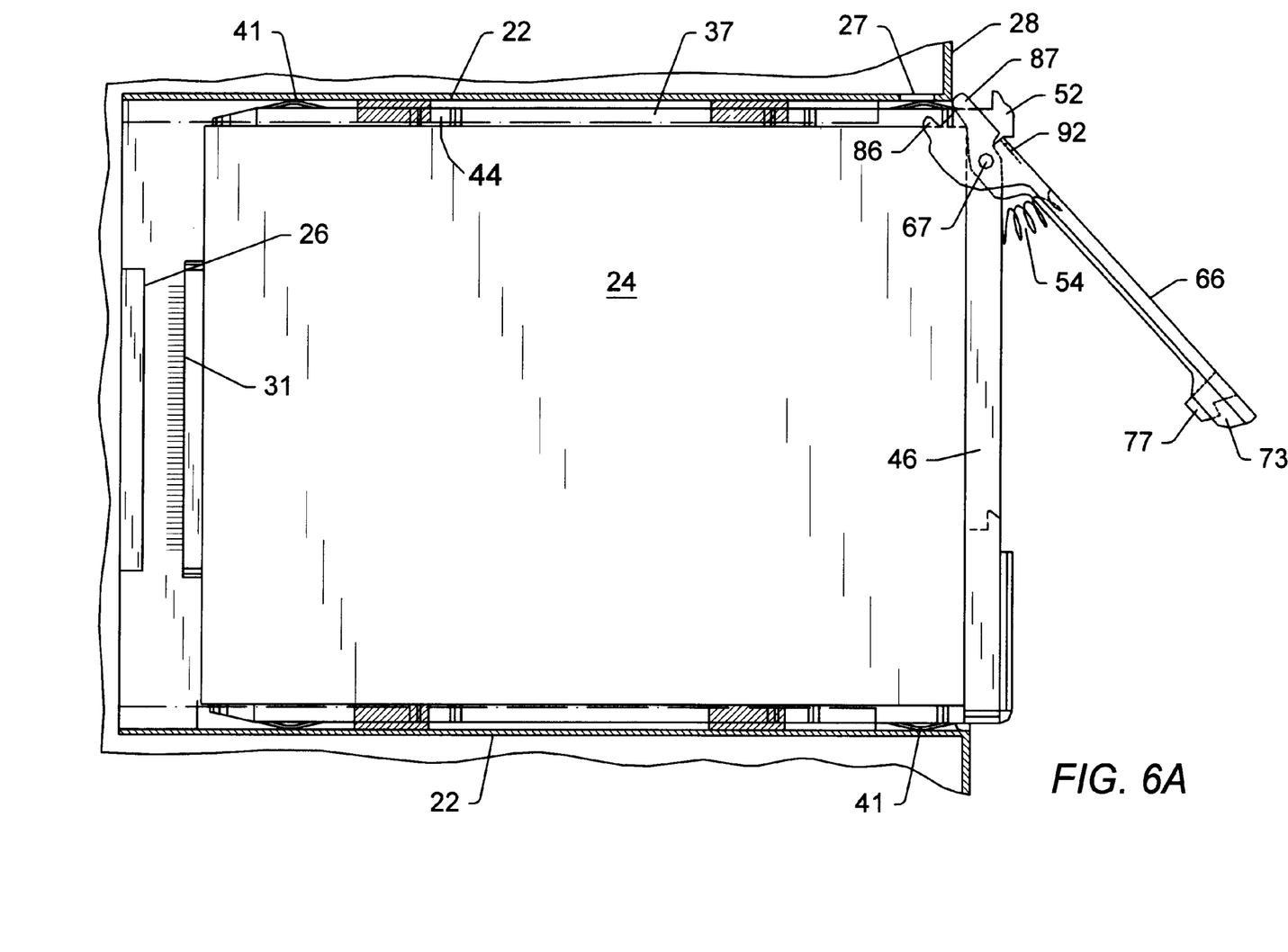
FIGS. 6A through 6C are bottom plan views showing sequential steps in insertion of the drive bracket.
Figure 6B:
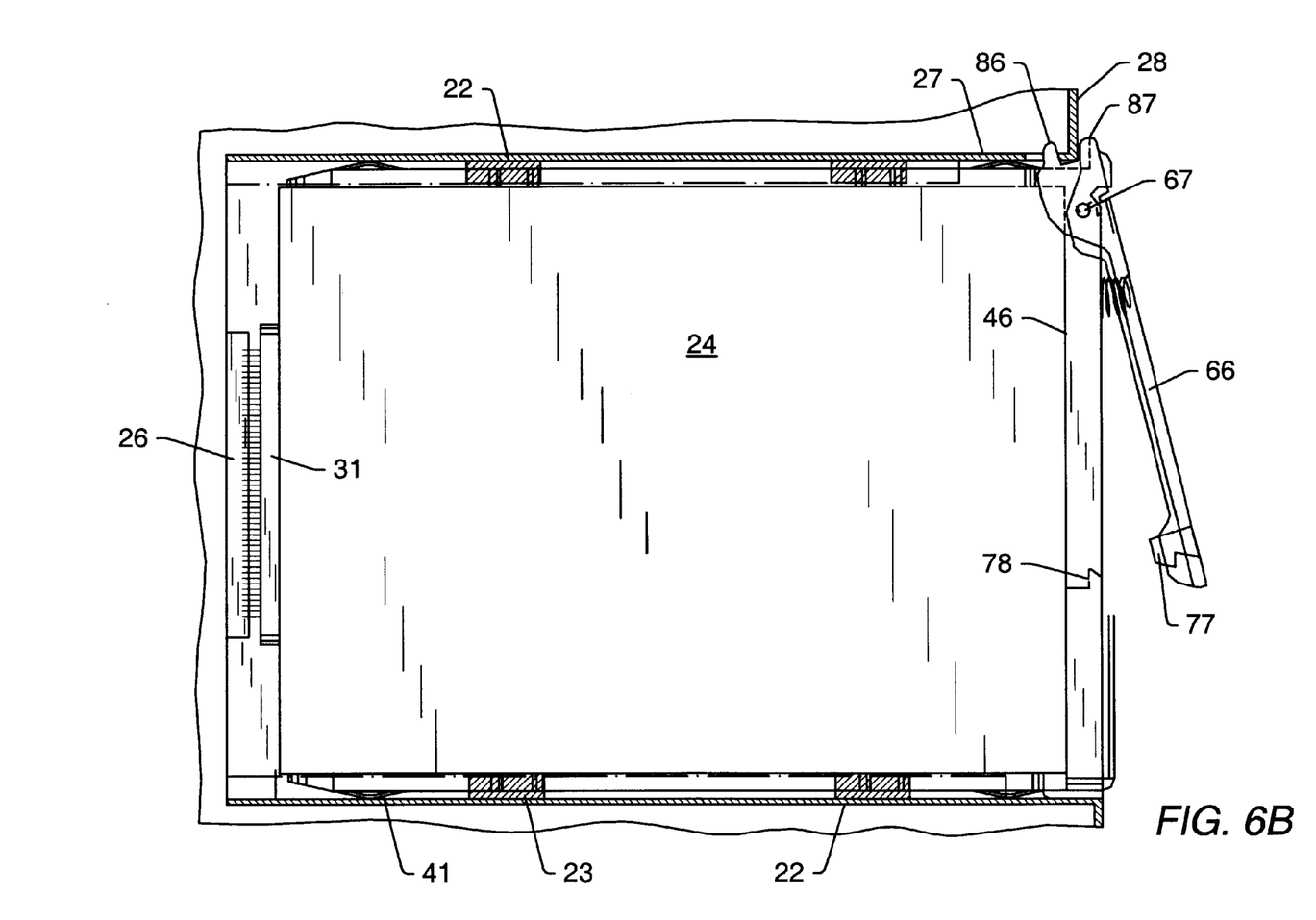
Figure 6C:
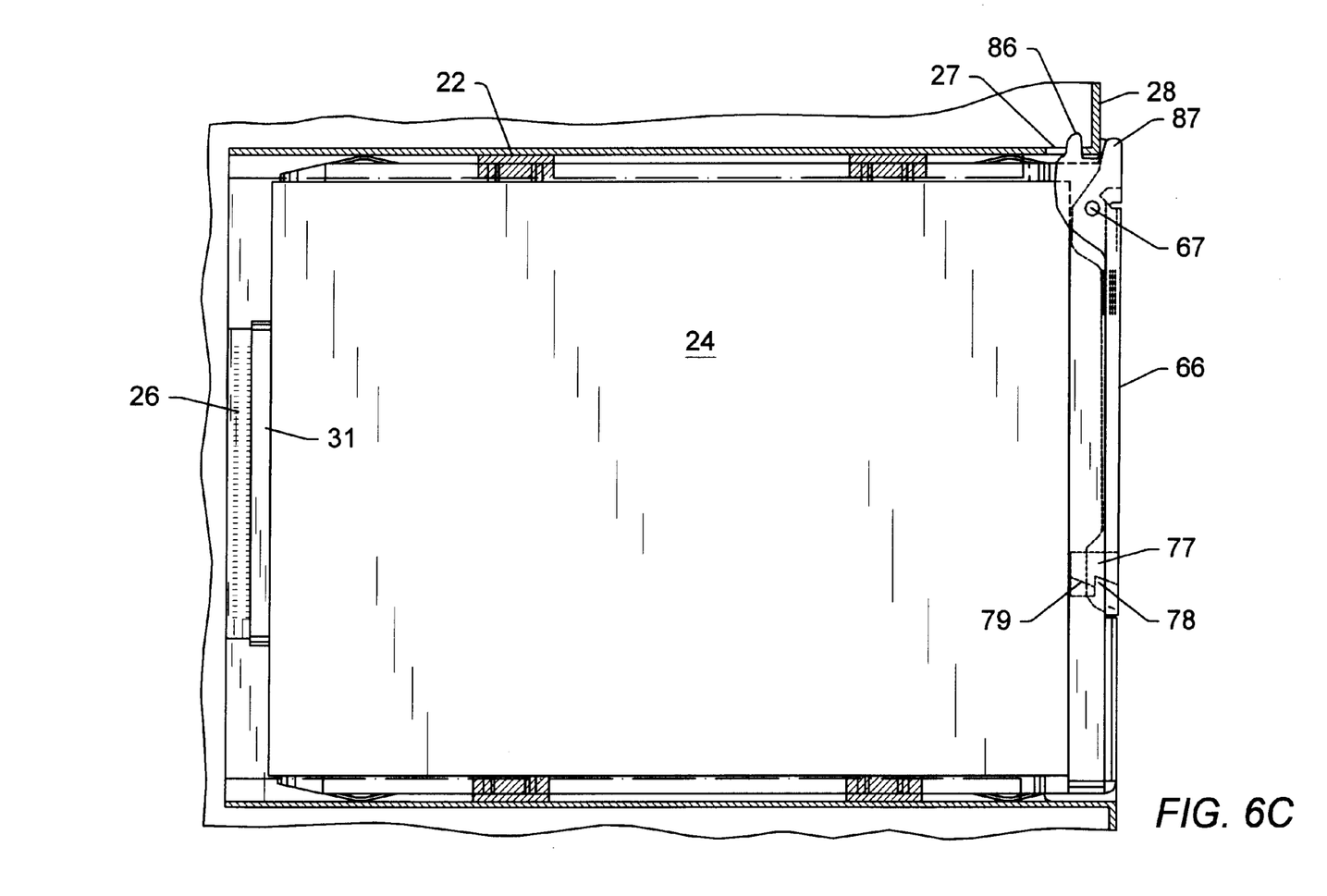

In order to install the disk drive 24, the user first pushes the slide 57 to the right, allowing barb 78 to disengage from hook 77 of handle 66. Under the influence of coil spring 54, the handle 66 pivots fully outwardly about 45°. The user then positions the disk drive 24 so that its back is within the guides 23, and then slides the disk drive inwardly of chassis 21 until the points 82, 87 abut the chassis side flange 28 (FIG. 6A). At this point there is no electrical connection between the disk drive plug 31 and the socket 26. The user then pivots handle 66 closed, hook 77 being engaged by barb 78. Pivoting the handle 66 closed causes finger 86 to engage the margin of slot 27, to force drive 24 inward at a measured speed until sockets 26, 31 engage stop 52 thus preventing further inward movement of the drive 24 (FIG. 6C).

When the drive is to be removed, the user pushes slide 57 to tie right so that hook 77 is disengaged from barb 78. Spring 54 causes handle 66 to open to about 15° until point 87 contacts flange 28, stopping swinging movement of handle 66 (FIG. 6B). At this point, electrical engagement of sockets 26, 31 is maintained since drive 24 has not been moved.. The user then inserts a finger between handle 66 and crosspiece 46 and pulls outwardly to cause the handle 66 to swing outwardly to about 45° (FIG. 6A). This action causes finger 86 to push against flange 28 and thus pull the drive 24 away from the chassis until sockets 26, 31 disengage (FIG. 6A). The user may then pull drive 24 outwardly out of guides 23. The handle 66 may be used to carry the disk drive, if desired.

During both installation and removal of the drive, the speed of engagement or disengagement of socket 26 with plug 31 is controlled by swinging movement of handle 66. When the handle 66 is in closed position, the drive is locked in proper position.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. For example, when the terms "vertical" or "horizontal" are used in the claims, they are to be understood to relate to the Figures as illustrated. However, the device may be turned at an angle to the horizontal or inverted with the quoted terms referring to the altered orientation.

What is claimed is:

1. A latch system for a computer chassis, comprising:
   a bracket;
   a handle pivotally mounted to the bracket, wherein an end of the handle is configured to engage the computer chassis;
   an engagement member couple to the handle; and
   a spring member coupled to the bracket, the spring member formed of a resilient material, and the spring member comprising:
      a slide movable in a first direction;
      a connector configured to couple the spring member to the bracket;
      a curved spring portion interconnecting the slide and the connector, the curved spring portion having a first section extending in the first direction, a second section curving in a second direction transverse to the first direction away from the first section, a third section curving in the second direction toward the connector, the curved spring portion resiliently deforming when the slide is moved in the first direction away from the connector and the connector is held stationary; and
      a catch, the catch configured to couple to the engagement member to hold the handle adjacent to the bracket in a closed position.

2. The latch system of claim 1, wherein said slide is formed with a recess shaped to enable a user to insert a finger into said recess and move the slide to release the engaging member from the catch.

3. The latch system of claim 1, further comprising a second curved spring portion extending generally parallel to said first-mentioned curved spring portion, said second curved spring portion having a fourth section parallel to and spaced in said second direction from said first section, a fifth section curving in said second direction away from said fourth section and toward said second section and a sixth section curving in said second direction toward said connector, said second curved spring portion being spaced in said second direction from said first-mentioned spring portion.

4. The latch system of claim 1, further comprising a spring coupled to the bracket and to the handle, wherein the spring is configured to rotate the handle away from the bracket when the engagement member is released from the catch.

5. The latch system of claim 1, wherein the end of the handle further comprises a first extension, wherein the first extension is configured to contact a surface of the computer chassis when the handle is moved from the closed position to an open position to provide a leverage point that facilitates removal of the bracket from the computer chassis.

6. The latch system of claim 5, wherein the end of the handle further comprises a second extension separated from the first extension by a notch, wherein the second extension is configured to contact an edge of a slot in the computer chassis when the handle is moved from the open position to the closed position.

7. The latch system of claim 1, further comprising indicia on a visible surface of the slide, the indicia configured to indicate that the slide should be moved in the first direction during use.

8. A latch system for holding a first member in a spaced relationship relative to a second member, comprising:
   a latch body having an anchoring portion, the anchoring portion configured to attach the latch body to a portion of the second member to inhibit axial movement of the anchoring portion relative to the portion of the second member;
   a slide portion of he latch body, the slide portion configured to move axially toward or away from the anchoring portion;
   a catch extending from the slide portion, wherein the catch is configured to hold an engaging member coupled to the first member when the slide portion is in an initial position;
   a spring member of the latch body coupled at a first end to the anchoring portion and coupled at a second end to the slide portion, and wherein the spring member comprises a resilient material having at least one bend formed between the first end and the second end; and
   wherein the spring member is configured to allow the slide portion to axially move from the initial position when the slide portion is moved in a first direction, wherein axial movement of the slide allows the catch to release the engaging member, and wherein the spring member is configured to return the slide portion to the initial position when the moving force is no longer applied to the slide portion.

9. The latch system of claim 8, wherein the slide portion further comprises a recess, the recess configured to allow the insertion of an object into the recess to facilitate movement of the slide portion of the latch body.

10. The latch system of claim 8, wherein moving the slide portion away from the anchoring portion allows release of the engaging member when the engaging member is held by the catch.

11. The latch system of claim 8, wherein the slide further comprises indicia formed in a surface of the slide, the indicia configured to indicate a direction of movement of the slide that will release the engaging member from the catch during use.

12. A latch system comprising:
   a bracket having a recess, wherein a portion of the bracket is positionable within a chassis;
   a handle pivotally coupled to the bracket, the handle comprising an engaging member and an end;
   a latch body configured to reside within the recess of the bracket, the latch body comprising:
      an anchoring portion configured to attach to the bracket;
      a slide configured to axially move within the recess;
      a catch coupled to the slide; and
      a member coupled to the anchoring portion and the slide, the member configured to return the slide to an initial position; and
   wherein the engaging member is configured to couple to the catch in a initial position to hold the handle stationary relative to the bracket, and wherein at least part of the end of the handle is configured to contact the chassis to inhibit removal of tile bracket from the chassis when the engaging member is coupled to the catch.

13. The latch system of claim 12, wherein the member comprises a first section coupled to the slide; a second section, which is substantially "U" shaped, coupled to the first section; and a third section coupled to the second section and to the anchoring portion.

14. The latch system of claim 13, wherein the member further comprises a fourth section coupled to the slide; a fifth section, which is substantially "U" shaped, coupled to the fourth section; and a sixth section coupled to the fifth section and to the anchoring portion.

15. The latch system of claim 12, further comprising a spring coupled to the bracket and to the handle, the spring configured to move the handle away from the bracket when the engaging member is released from the catch.

16. The latch system of claim 15, wherein the spring comprises a coil spring.

17. The latch system of claim 12, wherein the latch body is an integrally formed plastic piece.

18. The latch system of claim 12, wherein the slide further comprises a recess configured to facilitate axial movement of the slide.

19. The latch system of claim 12, wherein moving the slide in a direction away from the anchoring portion releases the engaging member from the catch to release the handle from the initial position.

20. The latch system of claim 12, wherein the end of handle comprises a first protrusion separated from a second protrusion by a notch, wherein the first protrusion is configured to pivot against the chassis to facilitate removing the bracket from the chassis when the engaging member is released from the catch.

* * * * *

UNITED STATES PATENT AND TRADEMARK OFFICE
CERTIFICATE OF CORRECTION

PATENT NO. : 6,378,965 B1 Page 1 of 1
DATED : April 30, 2002
INVENTOR(S) : Naum Reznikov, Michael F. McCormick, Jr., Ehsan Ettehadieh, Daniel Hruska and Anthony N. Eberhardt It is certified that error appears in the above-identified patent and that said Letters Patent is hereby corrected as shown below:

Column 6,
Line 12, before "latch", please delete "he" and insert -- the -- in place thereof.
Line 63, please delete "tile" and insert -- the -- in place thereof.

Signed and Sealed this

Tenth Day of September, 2002

Attest:

JAMES E. ROGAN
Attesting Officer         Director of the United States Patent and Trademark Office